United States Patent
Koo

(10) Patent No.: US 8,879,316 B2
(45) Date of Patent: Nov. 4, 2014

(54) SEMICONDUCTOR DEVICE AND METHOD OF GENERATING VOLTAGES USING THE SAME

(75) Inventor: Bon Kwang Koo, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 495 days.

(21) Appl. No.: 13/338,897

(22) Filed: Dec. 28, 2011

(65) Prior Publication Data

US 2012/0170367 A1    Jul. 5, 2012

(30) Foreign Application Priority Data

Dec. 30, 2010   (KR) .......................... 10-2010-0139182

(51) Int. Cl.
*G11C 11/34* (2006.01)
*G11C 16/04* (2006.01)
*G11C 16/12* (2006.01)
*G11C 5/14* (2006.01)
*G11C 8/08* (2006.01)

(52) U.S. Cl.
CPC ...... *G11C 16/12* (2013.01); *G11C 5/14* (2013.01); *G11C 8/08* (2013.01)
USPC ............. 365/185.03; 365/210.12; 365/189.09

(58) Field of Classification Search
USPC ............. 365/185.03, 185.01, 185.18, 189.09, 365/210.12, 189.011
See application file for complete search history.

(56) References Cited

U.S. PATENT DOCUMENTS

| 6,462,998 | B1 * | 10/2002 | Proebsting | 365/205 |
| 7,525,839 | B2 * | 4/2009 | Shibata et al. | 365/185.03 |
| 2003/0021163 | A1 * | 1/2003 | Nakazawa et al. | 365/189.12 |
| 2003/0103368 | A1 * | 6/2003 | Arimoto et al. | 365/63 |

FOREIGN PATENT DOCUMENTS

| KR | 1020040031865 A | 4/2004 |
| KR | 1020080101150 A | 11/2008 |

* cited by examiner

*Primary Examiner* — Son Dinh
*Assistant Examiner* — Uyen B Tran
(74) *Attorney, Agent, or Firm* — William Park & Associates Patent Ltd.

(57) ABSTRACT

A semiconductor device includes a register unit for storing additional bits associated with a command signal and outputting a selected additional bit corresponding to a received address; a combination circuit for combining received control bits and the selected additional bit, and outputting enable signals based on the combined bits, where the received control bits are generated in response to the command signal and a control signal; and a voltage generation circuit for outputting voltages distributed in response to the enable signals.

20 Claims, 4 Drawing Sheets

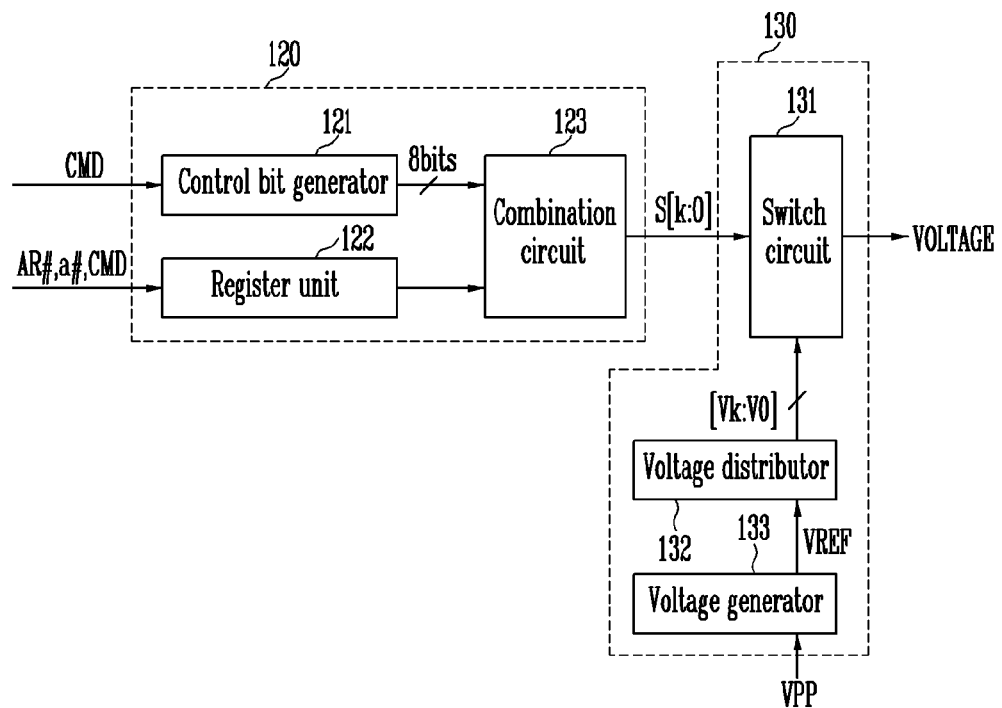

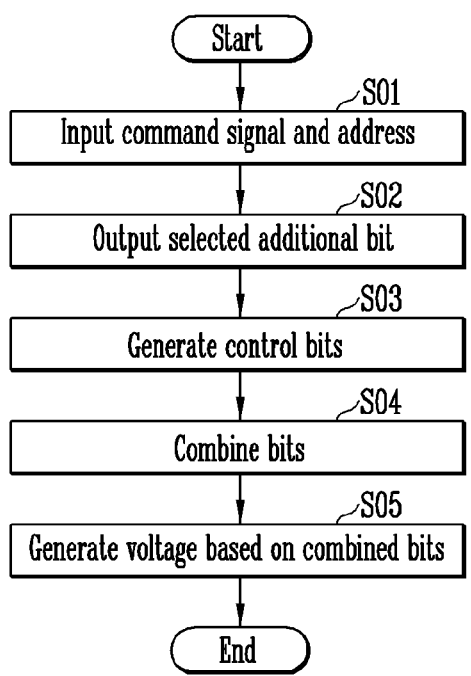

SEMICONDUCTOR DEVICE AND METHOD OF GENERATING VOLTAGES USING THE SAME

CROSS-REFERENCE TO RELATED APPLICATION

The present application claims priority under 35 U.S.C 119(a) to Korean patent application number 10-2010-0139182 filed on Dec. 30, 2010, the entire disclosure of which is incorporated by reference herein.

BACKGROUND

1. Field of the Invention

Embodiments relate to a semiconductor device and a method of generating voltages using the same and, more particularly to generation of voltages with various levels.

2. Description of the Related Art

NAND memory cells of semiconductor memory have an erase state or program states according to levels of threshold voltages. More particularly, a memory cell programmed with one level of threshold voltage is called a single level cell (hereinafter referred to as an 'SLC'), and a cell programmed with various levels of threshold voltages is called a multi-level cell (hereinafter referred to as an 'MLC').

Active research has recently been done on the MLC because the MCL typically has more capacity as compared with the SLC. In general, the MLC has one erase state and three program states, but a cell having one erase state and three or more program states is being developed.

FIG. 1 is a graph illustrating threshold voltage distributions of memory cells.

Memory cells having one erase state ER and seven program states PV1 to PV7 are described as an example with reference to FIG. 1. In order for memory cells to have seven program states as described above, seven program verification voltages Vf1 to Vf7 are required. In order to perform a read operation after the program routine, seven read voltages Vr1 to Vr7 are required.

That is, the number of voltage levels to be generated is increased in proportion to the number of program states. For example, in a semiconductor device having three program states, data of 8 bits is used in order to determine voltage levels. When data of 8 bits (that is, control bits) are used, 256 ($2^8=256$) voltages of different levels may have to be generated. Accordingly, voltage levels necessary for a program operation, a read operation, a verification operation, and an erase operation can be generated. However, with an increase in the number of program states, voltages of more various levels need to be generated with more accurate differences between levels.

BRIEF SUMMARY

According to exemplary embodiments, voltages of more various levels can be generated by adding additional bits to control bits.

Furthermore, voltages of various levels can be generated by configuring a control circuit to include a register for storing control bits and additional bits, selectively reading the data stored in the register when voltage is generated, and combining the data.

A semiconductor device according to an aspect of the present disclosure includes a register unit for storing additional bits associated with a command signal and outputting a selected additional bit corresponding to a received address; a combination circuit for combining received control bits and the selected additional bit, and outputting enable signals based on the combined bits, where the received control bits are generated in response to the command signal and a control signal; and a voltage generation circuit for outputting voltages distributed in response to the enable signals.

A method of generating voltages according to another aspect of the present disclosure includes generating control bits in response to a command signal; outputting a selected additional bit selected based on an address, from among additional bits associated with the command signal; combining the control bits and the selected additional bit to arrive at combined bits; outputting enable signals based on the combined bits; and outputting distributed voltages in response to the enable signals.

Another embodiment includes a semiconductor device comprising a register unit for storing additional bits associated with a command signal and outputting a selected additional bit corresponding to a received address among the additional bits; and a combination circuit for combining received control bits and the selected additional bit, and outputting enable signals based on the combined bits, where the received control bits are generated in response to the command signal and a control signal, and where the enable signals are associated with a voltage to be outputted.

BRIEF DESCRIPTION OF THE DRAWINGS

FIG. 3 is a detailed block diagram of a control circuit and a voltage generation circuit shown in FIG. 2;

FIG. 4 is a detailed diagram of a register unit shown in FIG. 3;

FIG. 6 is a flowchart illustrating a method of generating voltages according to an embodiment of this disclosure.

DESCRIPTION OF EMBODIMENTS

Hereinafter, some embodiments of the present disclosure will be described in detail with reference to the accompanying drawings. The figures are provided to allow those having ordinary skill in the art to understand a scope of the embodiments of the disclosure.

Figure 1:
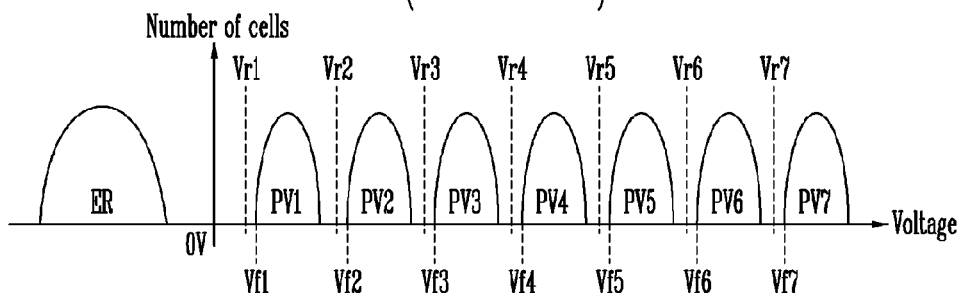
FIG. 1 is a graph illustrating threshold voltage distributions of memory cells.
Figure 2:
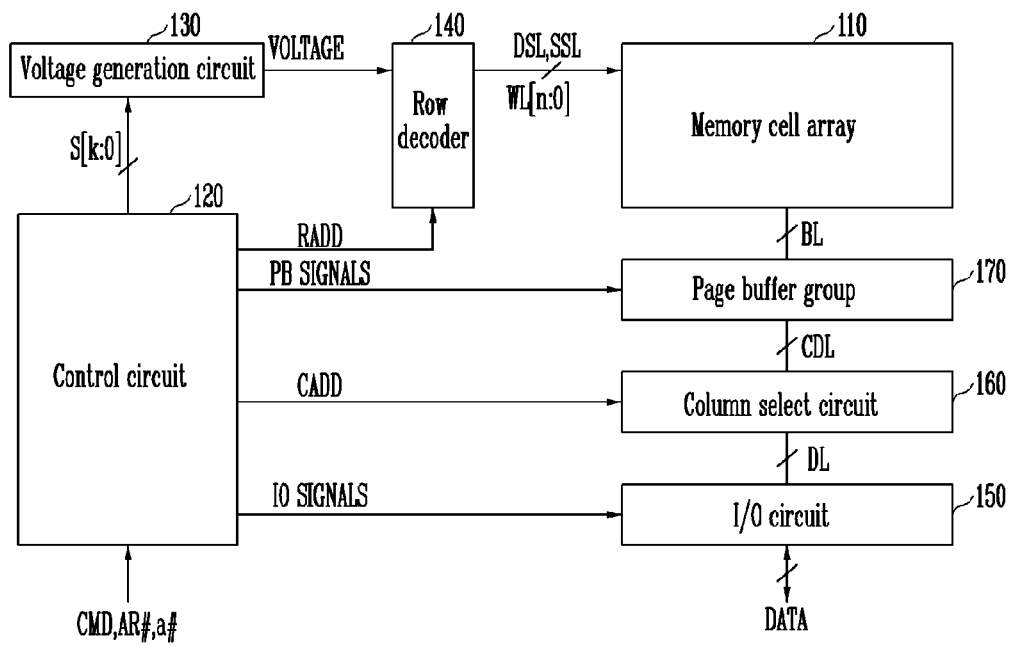
FIG. 2 is a block diagram of a semiconductor device according to this disclosure.

FIG. 2 is a block diagram of a semiconductor device according to this disclosure.

Referring to FIG. 2, the semiconductor device includes a memory cell array 110, a voltage generation group (120 and 130), a row decoder 140, an I/O circuit 150, a column select circuit 160, and a page buffer group 170.

The memory cell array 110 includes a plurality of cell blocks each including cell strings. Each of the cell strings includes a drain select transistor, memory cells, and a source select transistor which are coupled in series therebetween. Gates of the drain select transistors included in the different cell strings are coupled to form a drain select line DSL. Gates of the memory cells are coupled to form a plurality of respective word lines WL[n:0]. Gates of the source select transistors are coupled to form a source select line SSL. The drain select transistors are coupled to respective bit lines BL, and the source select transistors are in common coupled to a common source line.

The voltage generation group also includes a control circuit 120 and a voltage generation circuit 130.

The control circuit 120 generates control signals S[k:0], RADD, PB SIGNALS, CADD, and IO SIGNALS for a program, read, or erase operation. The control signals may be generated in response to a command signal CMD and addresses AR# and a#. In particular, the command signal CMD includes pieces of information corresponding to various operations and pieces of information for generating voltages of levels required in relevant operations. The signals S[k:0] of the control signals are enable signals for generating voltages of target levels VOLTAGE when various operations are performed.

The voltage generation circuit 130 generates the voltages VOLTAGE with various levels in response to the enable signals S[k:0] of the control circuit 120. For example, the voltage generation circuit 130 may generate various program voltages and various program pass voltages when a program operation is performed, various read voltages and various read pass voltages when a read operation is performed, and various erase voltages and various erase verification voltages when an erase operation is performed.

The row decoder 140 transfers the voltages VOLTAGE of the voltage generation circuit 130 to a selected cell block of the memory cell array 110 in response to the low address signals RADD of the control circuit 120. That is, the operating voltages are transferred to the local lines DSL, WL[n:0], and SSL of the selected cell block.

In order to transfer externally inputted data DATA to the page buffer group 170 when a program operation is performed, the I/O circuit 150 transfers the data DATA to the column select circuit 160 in response to I/O signals 10 SIGNALS received from the control circuit 120. When data DATA of the column select circuit 160 is sequentially transferred to page buffers of the page buffer group 170, the page buffers stores the received data in their latches. Furthermore, when a read operation is performed, the I/O circuit 150 externally outputs data DATA received from page buffers of the page buffer group 170 via the column select circuit 160.

The column select circuit 160 selects page buffers of the page buffer group 170 in response to the column address signal CADD of the control circuit 120. Data DATA latched in a page buffer selected by the column select circuit 160 is externally outputted through the I/O circuit 150.

The page buffer group 170 includes page buffers (not shown) coupled to respective bit lines BL. The page buffer group 170 supplies voltages, necessary to store data in memory cells of a selected cell block, to the respective bit lines BL in response to the page buffer control signals PB SIGNALS, where PB SIGNALS may be received from the control circuit 120. More particularly, the page buffer group 170 precharges the bit lines BL when the program operation, the erase operation, or the read operation is performed. Or, the page buffer group 170 latches data corresponding to levels of threshold voltages of the memory cells, where the threshold voltages are detected based on shifts of the voltages of the bit lines BL.

The control circuit 120 and the voltage generation circuit 130 are described in more detail below.

FIG. 3 is a detailed block diagram of the control circuit 120 and the voltage generation circuit 130 shown in FIG. 2.

Referring to FIG. 3, the control circuit 120 includes a control bit generator 121 for generating control bits of 8 bits in response to the command signal CMD and a control signal included in the command signal CMD. The control circuit 120 may also include a register unit 122 for generating at least 1 bit in response to the command signal CMD and the addresses AR# and a#. The control circuit may also include a combination circuit 123 for generating the enable signals S[k:0] necessary to output voltages of various levels, the combination circuit may generate the enable signals S[k:0] by combining the control bits of the control bit generator 121 and the at least 1 bit generated by the register unit 122.

The control bit generator 121 generates data of 8 bits (that is, the control bits of 8 bits) in response to the command signal CMD. To this end, the control bit generator 121 may be implemented using a plurality of registers. In this case, the control bit generator 121 may be implemented using a circuit for sequentially generating the control bits of 8 bits in series.

The register unit 122 stores an additional bit '0' or '1' associated with the command signal CMD. The register unit 122 generates the additional bit in response to the addresses AR# and a#. Using registers instead of circuits to store and generate the at least one additional bit of information may reduce the size of the semiconductor device. The register unit 122 is described in more detail below with reference to FIG. 4.

FIG. 4 is a detailed diagram of the register unit 122 shown in FIG. 3.

Although the register unit 122 includes three registers AR1 to AR3 in FIG. 4, the number of registers may be changed, if needed. The capacity of each of the registers AR1 to AR3 is 1 byte. Each register can store 8 bits, where each bit may be the at least 1 additional bit, because the 1 byte is composed of 8 bits. That is, the additional bit of 1 bit is stored in one of eight depositories forming the 1 byte of a register.

Furthermore, the addresses AR# and a# are assigned to each of the registers and each of the depositories, respectively. For example, an address AR1 may be assigned to a first register, an address AR2 may be assigned to a second register, and an address AR3 may be assigned to a third register. Furthermore, addresses a1 to a8 may be sequentially assigned to the respective depositories. Accordingly, when the addresses referenced are AR1 and a2, data 0 corresponding to the addresses AR1 and a2 are outputted.

A method of storing the additional bit in each of the registers may be various, but an embodiment is described below.

Additional bits necessary to output respective verification voltages MPV1 to MPV7 of a most significant bit (hereinafter referred to as an 'MSB') may be stored in the respective depositories a1 to a7 of the first register AR1. Additional bits necessary to output respective read voltages MR1 to MR7 of an MSB may be stored in the respective depositories a1 to a7 of the second register AR2. Additional bits necessary to output respective verification voltages CPV1 to CPV3 of a CSB may be stored in the respective depositories a1 to a3 of the third register AR3. Additional bits necessary to output respective read voltages CR1 to CR3 of a CSB may be stored in other depositories a4 to a6 of the third register AR3. If the additional bits are stored in each of the registers as described above, some depositories A, B, C, and D may store no data; or these depositories A, B, C, and D may be used to store data necessary for N (null) or other operations.

In the above example, the method of storing the additional bits relating to the verification voltages of an MSB and a CSB has been described. However, the additional bit relating to each of program, read, and erase operations may be stored in a greater number of the registers. Furthermore, if information about a plurality of addresses for selecting additional bits is included in the command signal CMD inputted to the control circuit 120, the register unit 122 may generate additional bits comprising 2 bits or more.

Referring back to FIG. 3, the combination circuit 123 generates the enable signals S[k:0] for outputting voltages of various levels by combining the control bits of 8 bits and the at least one additional bit generated in response to the command signal CMD and the addresses AR# and a#, and decoding the combined data.

More particularly, if the additional bit is '0', the enable signals S[k:0] are generated by using only the control bits of 8 bits. For example, 256 kinds of the enable signals S[k:0] corresponding to the 8th power of 2 may be generated as the control bits of 8 bits. On the other hand, if the additional bit is '1', a total of data of 9 bits can be generated by adding the additional bit of 1 bit to the control bits of 8 bits. Accordingly, more than the 256 enable signals S[k:0] can be generated. A detailed operation method is described below with reference to Table 1.

TABLE 1

| ADDITIONAL BIT | CONTROL BITS |
| --- | --- |
| 1 | 11111111 |
|   | 11111110 |
|   | 11111101 |
|   | 11111100 |
|   | ... |
|   | 00000011 |
|   | 00000010 |
|   | 00000001 |
|   | 00000000 |
| 0 | 11111111 |
|   | 11111110 |
|   | 11111101 |
|   | 11111100 |
|   | ... |
|   | 00000011 |
|   | 00000010 |
|   | 00000001 |
|   | 00000000 |

As shown in Table 1, when the additional bit is '0', data capable of outputting voltages of 256 different levels can be generated by using the control bits of 8 bits. When the additional bit is '1', data capable of outputting voltages of 256 different levels can be generated using the same control bits. Accordingly, when the additional bit is used, data capable of outputting voltages of various levels more than 256 can be generated.

For example, in the case of a verification operation, the additional bit is stored in any of the registers AR1 to AR3 of the register unit 122 as shown in FIG. 4. In the verification operation of an MLC, if a fourth MSB verification voltage has to be generated (that is, if a bit corresponding to 'MPV4' has to be selected), 1 bit of '0' is selected based on the addresses 'AR1' and 'a4' and outputted. The control bit generator 121 outputs the control bits of 8 bits corresponding to 'MPV4'. The outputted bits are inputted to the combination circuit 123. The combination circuit 123 combines the received data (that is, the 8 bits and the 1 bit), decodes the combined data, and outputs the enable signals S[k:0].

The combination circuit 123 outputs the enable signals S[k:0] corresponding to the number of voltage levels that may be generated. For example, if a total of 512 voltages of different levels have to be generated, the combination circuit 123 outputs the enable signals S[0] to S[511]. For another example, if voltages of 506 different levels have to be generated, the combination circuit 123 outputs the enable signals S[0] to S[505]. Accordingly, only one enable signal from among the enable signals S[0] to S[k] is outputted in a high level, and the remaining enable signals are outputted in a low level.

A voltage generator 133 receives a high voltage VPP and generates a reference voltage VREF. A voltage distributor 132 transfers voltage (that is, any one of voltages [V0] to [Vk]) to the circuit switch 131. The voltage distributor 132 may determine distributed voltages [Vk:V0] based on the reference voltage VREF. The switch circuit 131 outputs the distributed voltages [Vk:V0] of the voltage distributor 132 as voltage VOLTAGE necessary for an operation.

Figure 5:
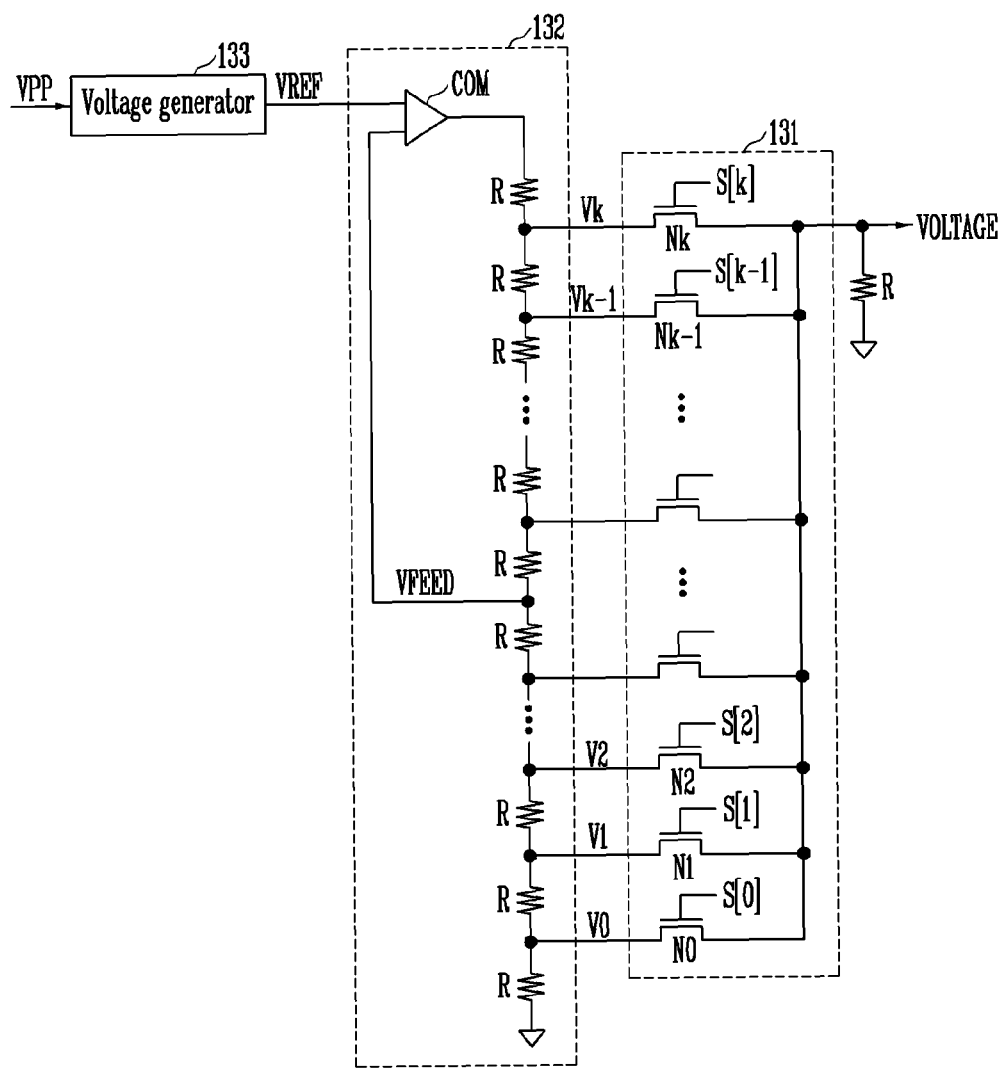
FIG. 5 is a detailed circuit diagram of the voltage generation circuit shown in FIG. 2.

FIG. 5 is a detailed circuit diagram of the voltage generation circuit 130 shown in FIG. 2.

Referring to FIG. 5, the voltage generation circuit 130 includes the voltage generator 133, the voltage distributor 132 and the switch circuit. The voltage distributor may receive the high voltage VPP and generate the reference voltage VREF. The voltage distributor 132 may output voltage that may be distributed based on the reference voltage VREF and a feedback voltage VFEED. The switch circuit 131 may output the distributed voltage in response to the enable signals S[k:0]. Furthermore, a resistor R is coupled to an output terminal of the switch circuit 131 and is configured to distribute the voltage received from the distributor 132. That is, the resistor R is coupled between a ground terminal and the output terminal of the switch circuit 131.

The voltage distributor 132 includes a comparator COM configured to output voltage based on the reference voltage VREF and the feedback voltage VFEED. The voltage distributor 132 may also comprise a plurality of resistors R coupled in series between a ground terminal and an output terminal of the comparator COM. The feedback voltage VREF refers to voltage supplied to a middle terminal of the resistors R coupled in series. A node between the resistors R is coupled to the switch circuit 131.

The switch circuit 131 includes a plurality of switches N0 to Nk. Each of the switches may be implemented using an NMOS transistor. The switches N0 to Nk are coupled between the output terminal of the switch circuit 131 and nodes between the resistors R of the voltage distributor 132. The switches N0 to Nk are operated in response to the enable signals S[k:0] received from the combination circuit 123. As an example, the $0^{th}$ switch N0 is described below. A drain of the $0^{th}$ switch N0 is coupled to a node between the first and the second resistors R which are adjacent to the ground terminal of the voltage distributor 132. A source of the $0^{th}$ switch N0 is coupled to the output terminal of the switch circuit 131. The first switch N1 is described as an example. A drain of the first switch N1 is coupled to a node of the voltage distributor 132 between the second and the third resistors R, and a source of the first switch N1 is coupled to the output terminal of the switch circuit 131. Likewise, the remaining second to $k^{th}$ switches N2 to Nk are coupled between the resistors R of the voltage distributor 132 and the output terminal of the circuit switch 131. Accordingly, only a switch (from among switches N0 to NK) that receives the enable signal (that is, any one of S[0] to S[k]) of a high level is turned on. The turned-on switch transfers one of the distributed voltages V0 to Vk, supplied to the drain of the relevant switch, to the output terminal.

FIG. 6 is a flowchart illustrating a method of generating voltages according to an embodiment of this disclosure.

Referring to FIG. 6, a command signal for a program, read, or erase operation, and an address are inputted at step S01. An additional bit necessary for a relevant operation is outputted based on the command signal and the address at step S02. The control bits are generated at step S03. Here, the steps S02 and S03 may be switched in order or may be simultaneously performed. The additional bit and the control bits are combined at step S04, and voltage adjusted based on the combined bits is generated at step S05.

As described above, the additional bits are stored in the registers. When various operations are performed, the stored additional bits are outputted, and the outputted additional bits and the control bits are combined. Accordingly, voltages of various levels can be easily generated. Furthermore, since the additional bits are stored in the registers and the stored bits (that is, data) are read, an additional circuit for generating the additional bits is not needed. Accordingly, an increase in a size of a memory device can be avoided. Furthermore, 1 bit or more additional bits can be easily used because the additional bits can be used by only selecting an address assigned to the register. Accordingly, voltages with more various levels can be generated.

According to this disclosure, data for generating voltages of various levels can be easily combined without an increase in the size of a semiconductor device by using the registers for storing additional bits instead of a circuit for generating the additional bits. Furthermore, since the number of additional bits can be easily increased, data for generating voltages of various levels can be easily generated although the number of program states is increased.

What is claimed is:

1. A semiconductor device, comprising:
   a register unit for storing additional bits associated with a command signal and outputting a selected additional bit corresponding to a received address among the additional bits;
   a combination circuit for combining received control bits and the selected additional bit, and outputting enable signals based on the combined bits, where the received control bits are generated in response to the command signal and a control signal; and
   a voltage generation circuit for outputting voltages distributed in response to the enable signals.

2. The semiconductor device of claim 1, further comprising a control bit generator for generating the control bits wherein the control bit generator serially outputs the control bits 8 bits in response to the command signal and the control signal.

3. The semiconductor device of claim 1, wherein the register unit comprises registers each of which stores 1 byte of data.

4. The semiconductor device of claim 3, wherein the registers comprise:
   a register for storing the additional bits for a program operation;
   a register for storing the additional bits for a read operation; and
   a register for storing the additional bits for an erase operation.

5. The semiconductor device of claim 3, wherein the registers store the additional bits for a program, a read, and an erase operation.

6. The semiconductor device of claim 3, wherein each of the registers comprises eight depositories for storing data of 8 bits.

7. The semiconductor device of claim 6, wherein the received address is assigned to each of the registers and each of the depositories.

8. The semiconductor device of claim 1, wherein the voltage generation circuit comprises:
   a voltage generator for generating a reference voltage;
   a voltage distributor for generating distributed voltages of various levels based on the reference voltage and a feedback voltage; and
   a switch circuit for outputting the distributed voltage as voltage for a relevant operation in response to the enable signals.

9. The semiconductor device of claim 8, wherein the voltage distributor comprises:
   a comparator for outputting the distributed voltages to an output terminal in response to the reference voltage and the feedback voltage; and
   a plurality of resistors coupled in series between the output terminal and a ground terminal.

10. The semiconductor device of claim 9, wherein the feedback voltage is supplied to a node between two resistors placed in a middle of the resistors.

11. The semiconductor device of claim 9, wherein the switch circuit comprises a plurality of switches each coupled between the resistors of the distributor and configured to share the output terminal.

12. The semiconductor device of claim 11, wherein the plurality of switches are implemented using respective NMOS transistors operated in response to respective enable signals.

13. The semiconductor device of claim 11, wherein the switches are turned on in response to respective enable signals and each configured to transfer the voltage, distributed into the node between relevant resistors of the resistors, to the output terminal.

14. A method of generating voltages, comprising:
   generating control bits in response to a command signal;
   outputting a selected additional bit selected based on an address, from among additional bits associated with the command signal;
   combining the control bits and the selected additional bit to arrive at combined bits;
   outputting enable signals based on the combined bits; and
   outputting distributed voltages in response to the enable signals.

15. The method of claim 14, wherein the control bits are any one of 00000000 to 11111111.

16. The method of claim 14, wherein the selected additional bit is 0 or 1.

17. The method of claim 16, wherein if the selected additional bit is 0, the enable signals are outputted based on the control bits.

18. The method of claim 16, wherein if the selected additional bit is 1, the control bits and the additional bit of 1 are combined and the enable signals are outputted based on the combined bits.

19. A semiconductor device, comprising:
   a register unit for storing additional bits associated with a command signal and outputting a selected additional bit corresponding to a received address among the additional bits; and
   a combination circuit for combining received control bits and the selected additional bit, and outputting enable signals based on the combined bits, where the received control bits are generated in response to the command signal and a control signal, and where the enable signals are associated with a voltage to be outputted.

20. The semiconductor device of claim 19, wherein the register unit comprises registers each of which stores 1 byte of data, where the registers further comprise:
   a register for storing the additional bits for a program operation;
   a register for storing the additional bits for a read operation; and
   a register for storing the additional bits for an erase operation.

* * * * *